US011071221B2

(12) United States Patent
Holahan et al.

(10) Patent No.: US 11,071,221 B2
(45) Date of Patent: Jul. 20, 2021

(54) MULTI-CARD SUBSYSTEM FOR EMBEDDED COMPUTING SYSTEMS

(71) Applicant: General Dynamics Mission Systems, Inc., Fairfax, VA (US)

(72) Inventors: Michael M. Holahan, Fairfax, VA (US); Nick R. Bober, Fairfax, VA (US)

(73) Assignee: General Dynamics Mission Systems, Inc., Fairfax, VA (US)

(*) Notice: Subject to any disclaimer, the term of this patent is extended or adjusted under 35 U.S.C. 154(b) by 0 days.

(21) Appl. No.: 16/232,391

(22) Filed: Dec. 26, 2018

(65) Prior Publication Data

US 2020/0214153 A1   Jul. 2, 2020

(51) Int. Cl.
*H05K 5/02* (2006.01)
*H05K 7/20* (2006.01)

(52) U.S. Cl.
CPC ......... *H05K 5/0269* (2013.01); *H05K 5/0213* (2013.01); *H05K 5/0291* (2013.01); *H05K 7/20163* (2013.01); *H05K 7/20309* (2013.01); *H05K 7/20318* (2013.01)

(58) Field of Classification Search
CPC .. H05K 1/0201; H05K 1/0212; H05K 5/0269; H05K 5/0291; H05K 7/20163; H05K 7/20309; H05K 7/20318
USPC .................... 361/679.54, 720, 697
See application file for complete search history.

(56) References Cited

U.S. PATENT DOCUMENTS

| 6,778,389 B1* | 8/2004 | Glovatsky | H01L 25/065 165/80.1 |
| 7,207,695 B2* | 4/2007 | Coushaine | F21K 9/00 362/240 |
| 8,279,597 B2* | 10/2012 | El-Essawy | G06F 1/181 165/80.3 |
| 8,456,000 B2* | 6/2013 | Baek | H01L 23/467 257/724 |
| 2012/0314369 A1* | 12/2012 | Wu | H01L 23/427 361/701 |
| 2014/0293531 A1* | 10/2014 | Brooks | H05K 3/00 361/679.47 |
| 2015/0181763 A1 | 6/2015 | de Bock et al. | |
| 2017/0223868 A1* | 8/2017 | Zheng | H01Q 1/002 |

FOREIGN PATENT DOCUMENTS

JP          S57118656 A     7/1982

* cited by examiner

*Primary Examiner* — Mukundbhai G Patel
(74) *Attorney, Agent, or Firm* — LKGlobal | Lorenz & Kopf, LLP

(57) ABSTRACT

A mounting frame apparatus is provided for embedding cards within an electronics system and includes a multi-card swappable subsystem. The apparatus further includes a chassis for containing the multi-card swappable subsystem. One or more heatsinks are used for cooling cards disposed in the four-card swappable subsystem.

20 Claims, 12 Drawing Sheets

MULTI-CARD SUBSYSTEM FOR EMBEDDED COMPUTING SYSTEMS

TECHNICAL FIELD

Embodiments of the subject matter described herein relate generally to embedded computing systems, and, more particularly, to a multi-card subsystem for embedded computing systems.

BACKGROUND

A circuit card chassis assembly is typically used to mount industry standard circuit cards for various electronic applications, such as embedded computing systems. The circuit card chassis assembly may include a chassis supporting one or more modules for mechanically securing and electrically interconnecting the circuit cards and a power supply. Such circuit card chassis assemblies may be equipped with different circuit cards for various applications including but not limited to embedded computing systems for defense, military and aircraft applications.

The circuit cards used in such applications and platforms typically include powered integrated circuits and other electronic components that generate significant heat which must be dissipated during operation. Such cooling has traditionally been accomplished by conducting heat away from the electronics through the circuit board and/or rail structure, then dissipating heat from the rail structure through natural or forced convection. In some instances, cooling air may be directed to impinge directly on the components and/or circuit card.

In order to address the significant heat generated during operation, there is a need for improving cooling systems that efficiently and effectively provides cooled circuit card modules utilized in a chassis assembly.

BRIEF SUMMARY

In an embodiment, a mounting frame apparatus is provided for embedding cards within an electronics system and includes a multi-card swappable subsystem. The apparatus further includes a chassis for containing the multi-card swappable subsystem. One or more heatsinks are used for cooling cards disposed in the four-card swappable subsystem.

In another embodiment, systems, apparatuses, and methods are directed to mounting frame structure for embedding cards within an electronics system. The mounting frame includes a multi-card swappable subsystem. A chassis contains the four-card swappable subsystem. A cooling structure for supplying cooling air to the four-card swappable subsystem. A heatsink for cooling cards is disposed in the four-card swappable subsystem.

In another embodiment, a mounting frame apparatus is provided for embedding cards within an electronics system and includes a four-card swappable subsystem. The apparatus further includes a chassis for containing the four-card swappable subsystem. A cooling structure supplies a cooling fluid to the four-card swappable subsystem. One or more heatsinks are used for cooling cards disposed in the four-card swappable subsystem. The cooling structure includes a condenser channel and an evaporator channel so that heat generated during operation of the embedded cards is exhausted into ambient environment.

In another embodiment, a mounting frame apparatus is provided for embedding cards within an electronics system and includes a four-card swappable subsystem. The apparatus further includes a chassis for containing the four-card swappable subsystem. The chassis contains a card rail module that includes a pair of card rails arranged in a spaced facing relationship for holding a circuit card therebetween. A cooling structure supplies a cooling fluid to the four-card swappable subsystem. One or more heatsinks are used for cooling cards disposed in the four-card swappable subsystem. The cooling structure may include a condenser channel and an evaporator channel so that heat generated during operation of the embedded cards is exhausted into ambient environment.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
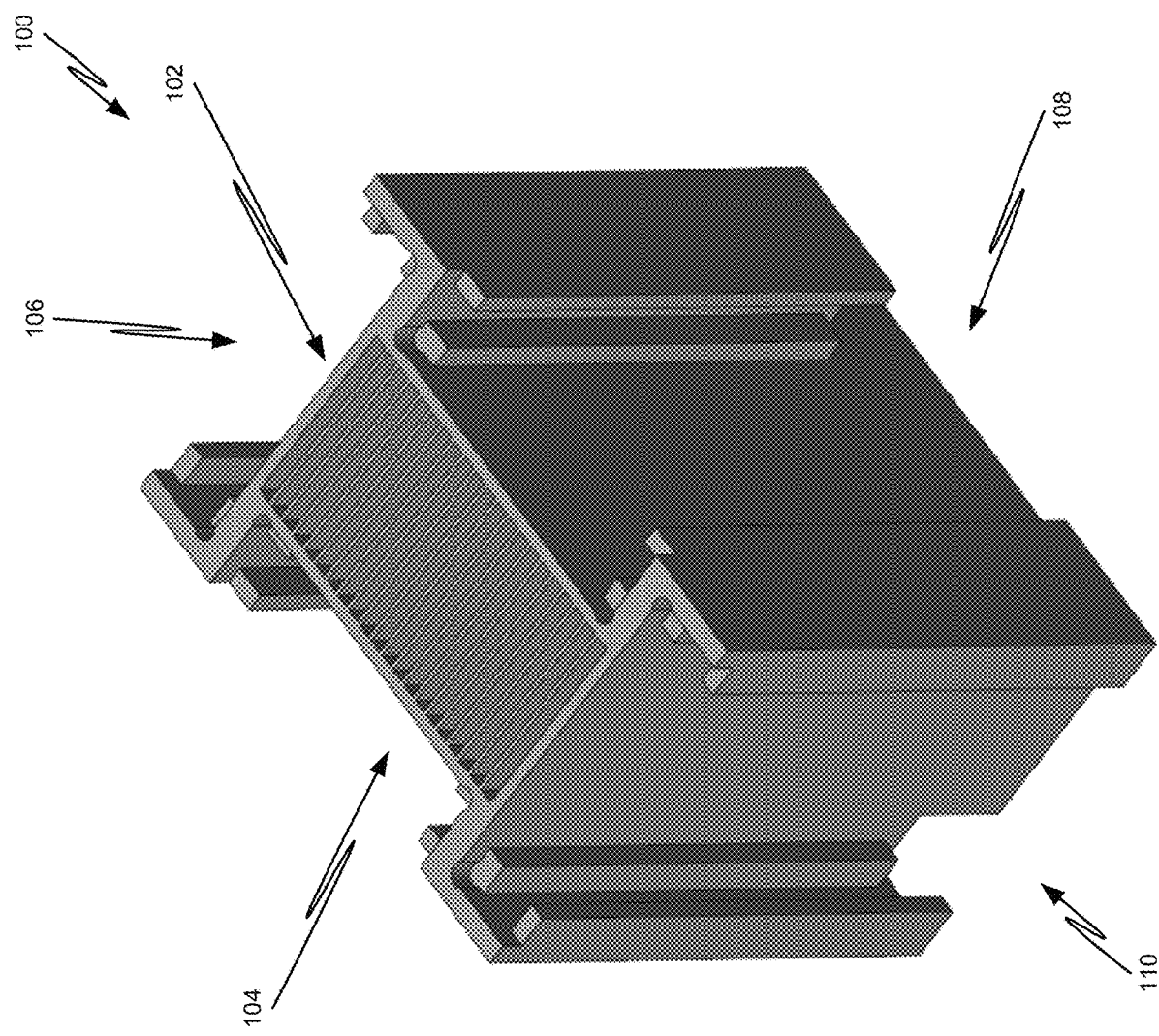
FIG. 1 is a top perspective view depicting an example embodiment of a chassis for modular swappable computing elements.

FIG. 1 depicts a chassis 100 for embedding cards within an electronics system. The chassis 100 has a multi-module accommodating heatsink 102 for modular placement into the embedded electronics system. In this example, the chassis has slots (104, 106, 108, 110) for holding four swappable cards around the centralized heatsink 102. This arrangement accommodates multiple cards (e.g., four 3 U sized circuit cards, etc.) to share a common heatsink 102 for improved cooling ability. It should be understood that the slots can be sized and oriented differently than the configuration depicted in FIG. 1. For example, slots can be sized for cards other than 3 U sized circuit cards.

The cooling structure allows for a single fan or ducted cooling air (not shown) to be distributed to four computing modules configured around the centralized heatsink 102 that is removable from the chassis 100. The improved cooling ability is a result, among other reasons, of allowing the card edge and the module frame face to mate to the heatsink 102 while redefining the modularity of the configurable chassis 100.

The chassis configuration depicted in FIG. 1 can be used for many different purposes. For example, it can be used as a mounting frame for 1-inch VITA compliant 3 U VPX cards modular swappable 4-card subsystem. Additionally, the chassis configuration can be used for aviation systems, such as military grade electronic systems, as well as used with land-based electronic platforms.

The chassis depicted in FIG. 1 can also be configured to hold more than four cards. A chassis can be scalable to include additional cards. The number of additional cards for the chassis could be greater than four, such as between five and twelve.

Figure 2:
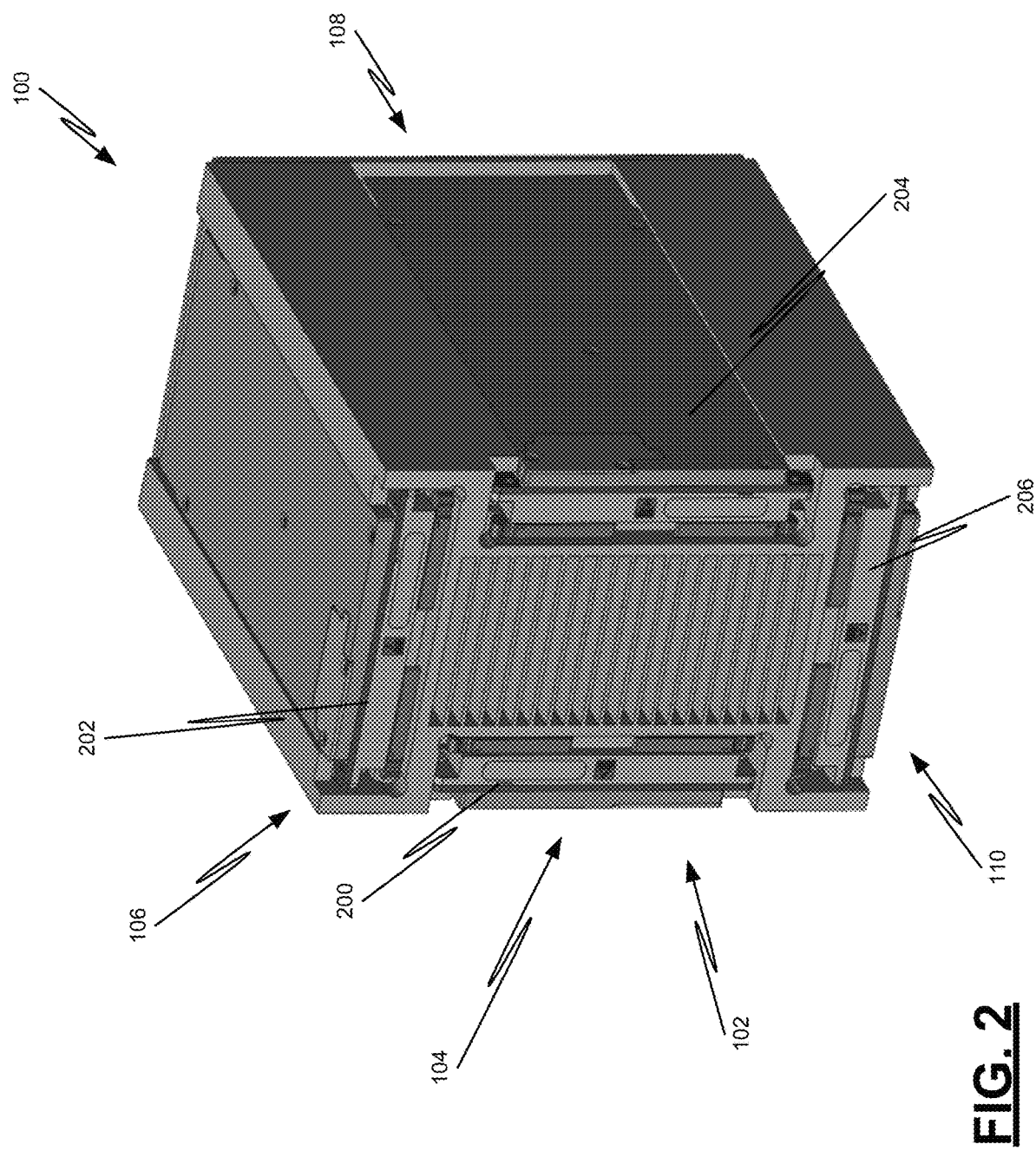
FIG. 2 is a top perspective view depicting an example embodiment of a chassis populated with four computing elements.

FIG. 2 depicts an example embodiment of a chassis 100 populated with four computing modules (200, 202, 204, 206). The four computing modules (200, 202, 204, 206) are inserted into the slots (104, 106, 108, 110). Heat generated by the four computing modules (200, 202, 204, 206) during operation are dissipated by the common heatsink 102.

The chassis 100 that holds the four computing modules (200, 202, 204, 206) can be manufactured using different approaches. As an example, the chassis may be extruded using a structurally strong, highly-conductive material. However, it should be understood that other manufacturing approaches may be used, such as 3-D printing, etc.

Figure 3:
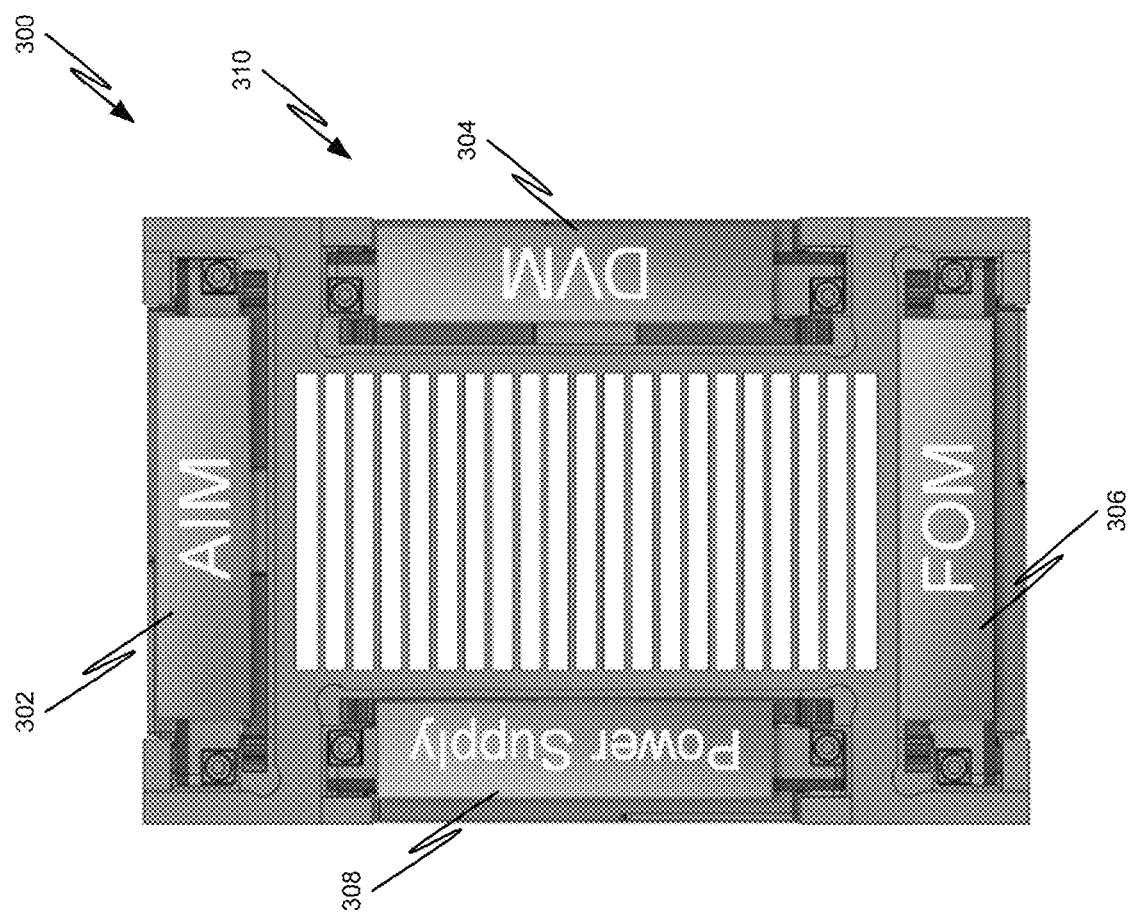
FIG. 3 depicts an example of a chassis populated with a video processing suite.
Figure 4:
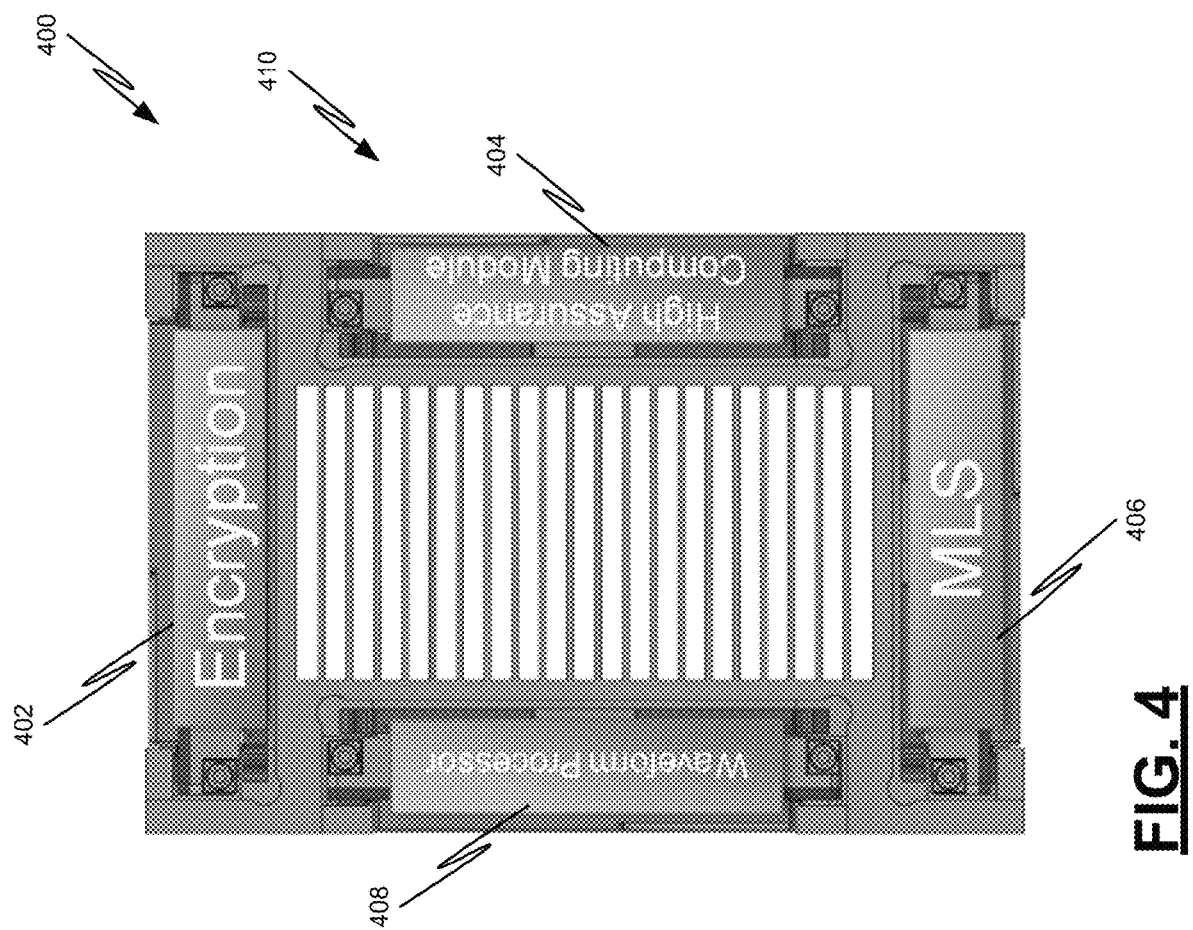
FIG. 4 depicts an example of a chassis populated with a trusted communications suite.
Figure 5:
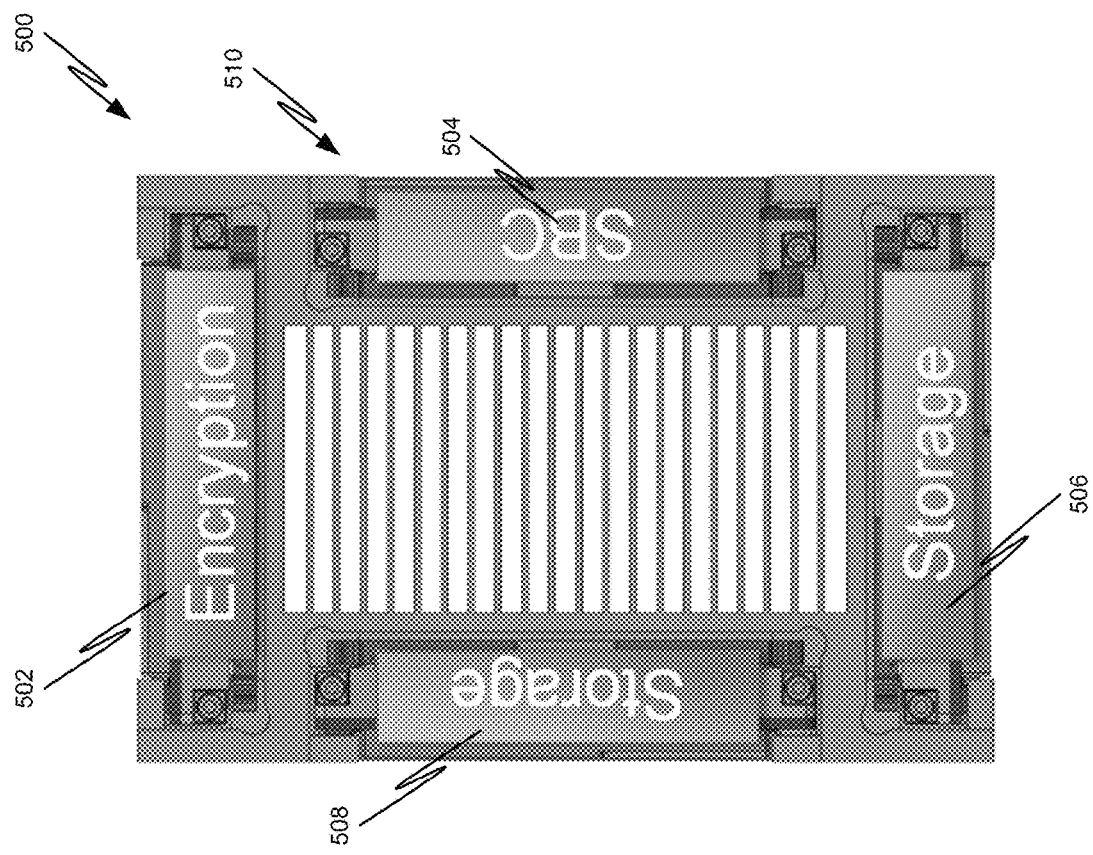
FIG. 5 depicts an example of a chassis populated with a trusted storage suite.

FIGS. 3-5 illustrate that a four-card swappable system can configured as different types of application-specific suites. The various configurations show plug and play solutions with a focus on modularity. This design allows an entire suite of functionally-related cards to be swapped at a time, thereby reducing reconfiguration time and ease of serviceability in the field. However, it should be understood that modules may be individually exchanged within a functional subsystem based on thermal cooling needs as well as signal integrity. The common chassis frame may be reused for different functional subsystems.

As an example of an application-specific suite, FIG. 3 depicts a video processing suite at 300. The video processing suite 300 includes four modules: a high-grade cryptographic processing card, such as an Advanced Imaging Module (AIM) 302; Digital Video Module (DVM) 304; Fiber Optic Module (FOM) 306; and a power supply 308. The modules (302, 304, 306, 308) surround a common heatsink 310.

As another example, FIG. 4 depicts a chassis 400 populated with a trusted communications suite. The trusted communications suite 400 includes four modules: an encryption card 402; high assurance computing module 404; a multi-level security module (MLS) 406; and a waveform processor 408. The modules (402, 404, 406, 408) surround a common heatsink 410.

As another example, FIG. 5 depicts a chassis 500 populated with a trusted storage suite. The trusted storage suite 500 includes four modules: an encryption card 502; Single Board Computer (SBC) 504; and two data storage modules (506, 508). The modules (502, 504, 506, 508) surround a common heatsink 510.

Figure 6:
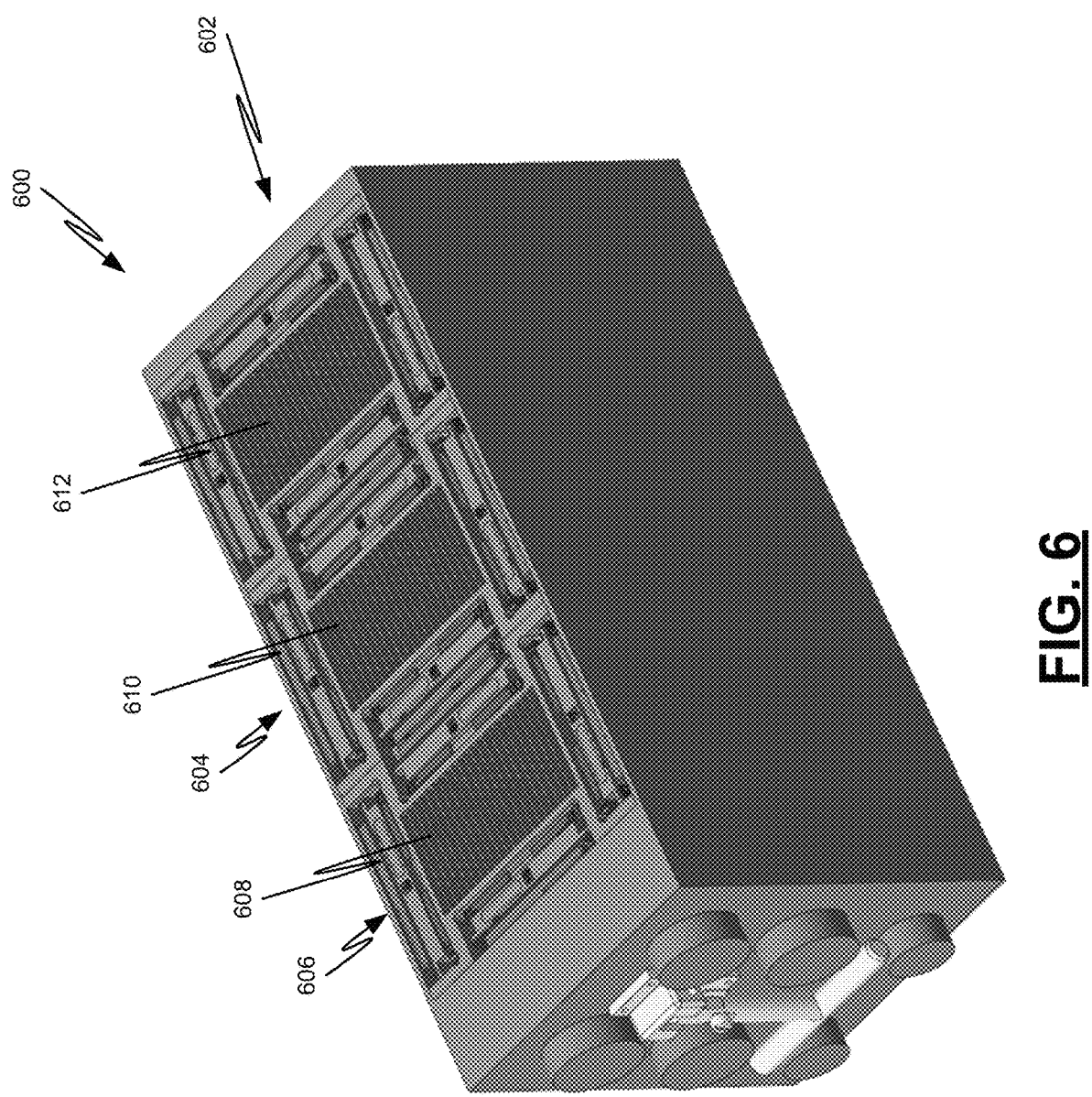
FIG. 6 depicts an example of a populated 12-card chassis.

FIG. 6 depicts a scalable chassis 600 that is configured to contain 12 cards as shown at 602, 604, 606 for providing multiple application suites. The 12 cards depicted at 602, 604, 606 are contained in three sets of four-card swappable systems. The populated 12-card chassis 600 contains an advanced imaging suite 602, a trusted storage suite 604, and a trusted communication suite 606. Each of the suites (602, 604, 606) has a common heatsink (608, 610, 612).

Figure 7:
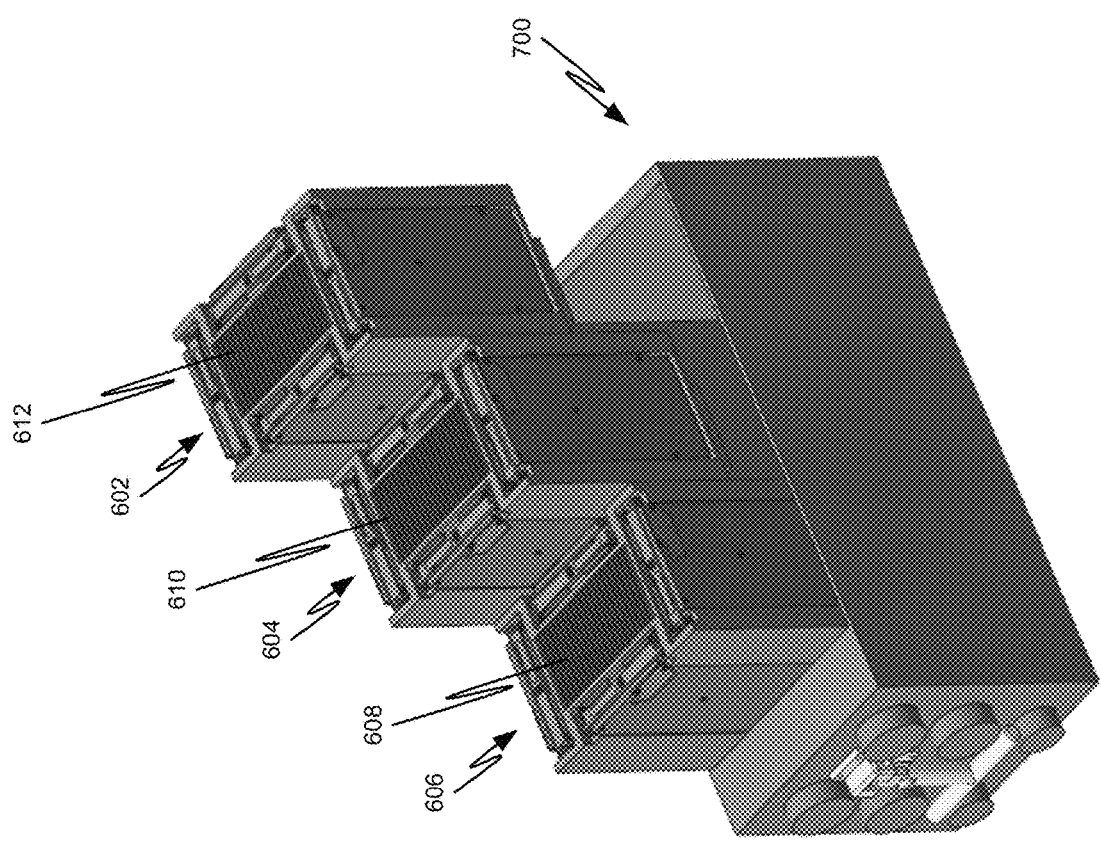
FIG. 7 depicts an example of a populated 12-card chassis with a stackable configuration.

Many other scalable configurations can be used. FIG. 7 provides another example of a populated 12-card chassis 700 with a stackable configuration. The populated 12-card chassis 700 stacks an advanced imaging suite 602, a trusted storage suite 604, and a trusted communication suite 606. Each of the suites (602, 604, 606) in FIG. 7 has a common heatsink (608, 610, 612).

The 4-card chassis configurations provide improved cooling capability. FIGS. 8-12 illustrate the improved capability.

Figure 8:
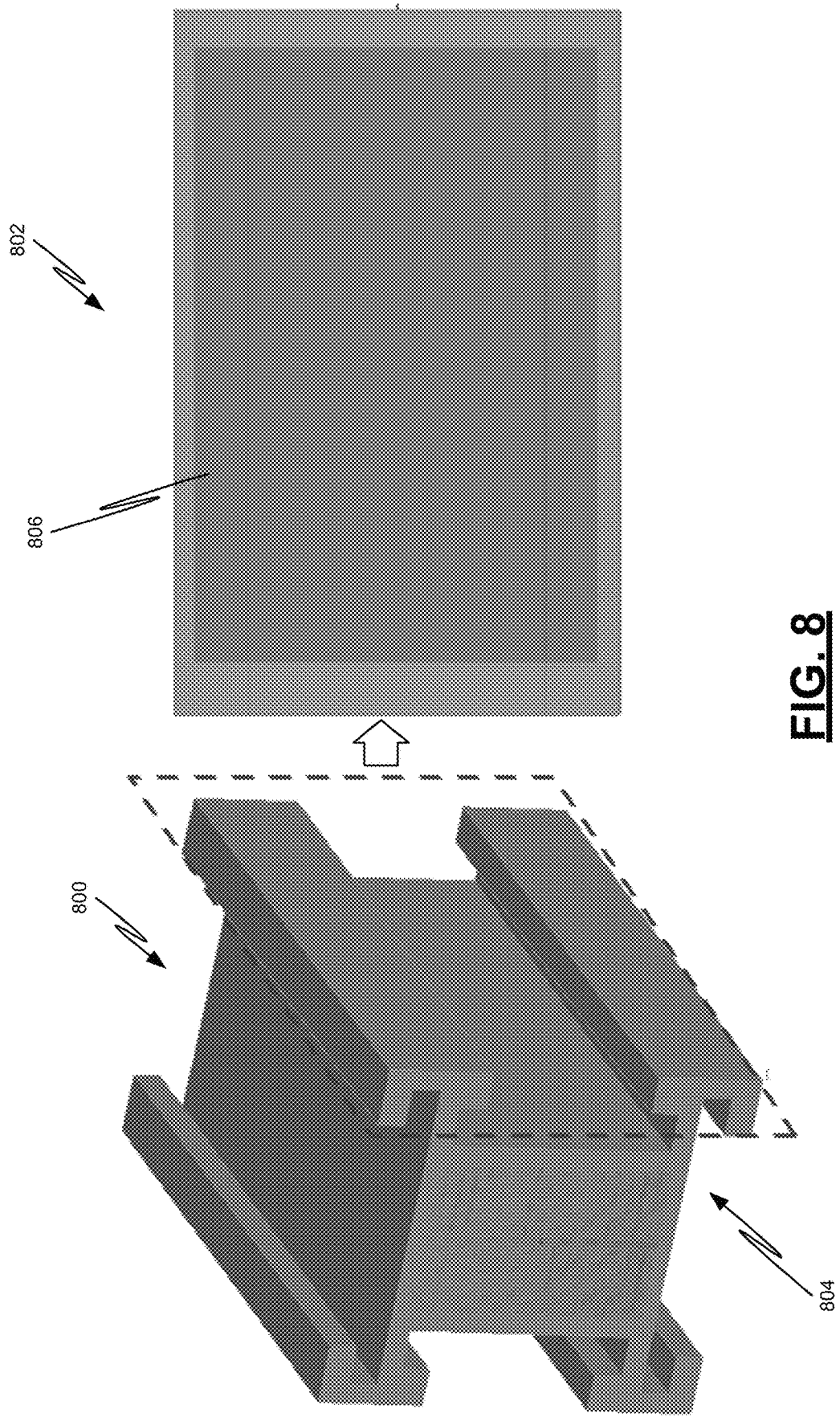
FIG. 8 depicts an example of a cross-sectional area of a 4-card chassis example.

FIG. 8 depicts a 4-card chassis 800 and its cross-sectional area 802. In this example, the chassis 800 is configured to cool cards via a module frame-to-heatsink contact, such as shown at 804. It should be understood that the specific configuration of the chassis shown in FIG. 8 may be adapted based on the specifications and functional requirements of a given application such that the cross-section may have a different cross-sectional geometry than specifically illustrated in the figure. The configuration of FIG. 8 provides an additional thermal transfer area where most or all of the entire surface area 806 is used for thermal transfer. In some embodiments, the increased thermal efficiency may reduce the amount of power required for fan provided airflow. This in turn may provide for smaller fans and alter chassis dimensions, thereby allowing more room for increased capability within the same form factor.

Still further, other cooling configurations can be used for the chassis assemblies described herein. As examples, FIGS. 9-12 depict 4-card chassis assemblies with a heat pipe configuration for cooling cards. The heat pipe configuration includes internal cavities to the heatsink structure that transports the heat from rail portions of the chassis.

Figure 9:
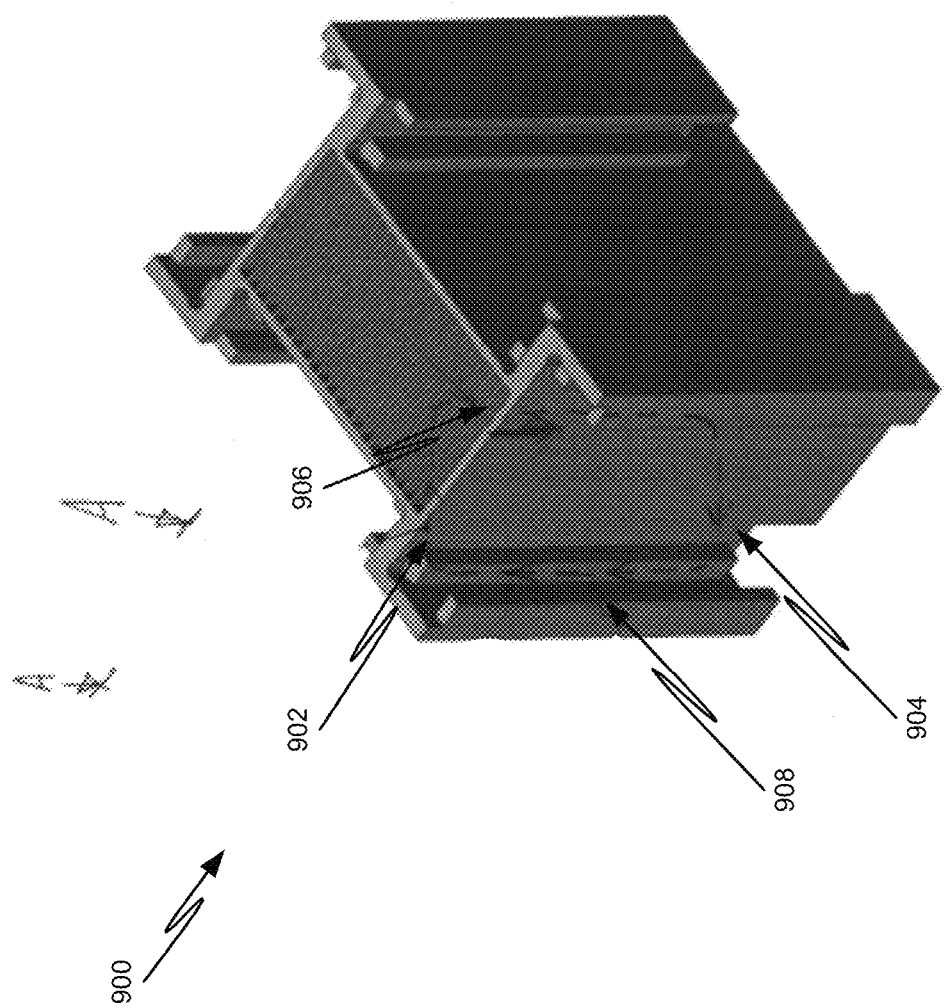
FIGS. 9-12 depict examples of chassis assemblies with various heat pipe configurations.

FIG. 9 depicts at 900 a 4-card chassis with internal heat pipes. Heat generated by components of the embedded computing system is conducted from the circuit cards to the card rail. The heat is transferred to a fluid (e.g., liquid, vapor, etc.) which circulates internally within the heat pipes.

The direction of the fluid within an embedded heat pipe 902 is shown at 904. The direction is in a clockwise manner. The cooling fluid flows through a condenser channel 906 and reaches an evaporator channel 908 during the cooling cycle. Heat is exhausted into the ambient environment surrounding the embedded computing system.

Figure 10:
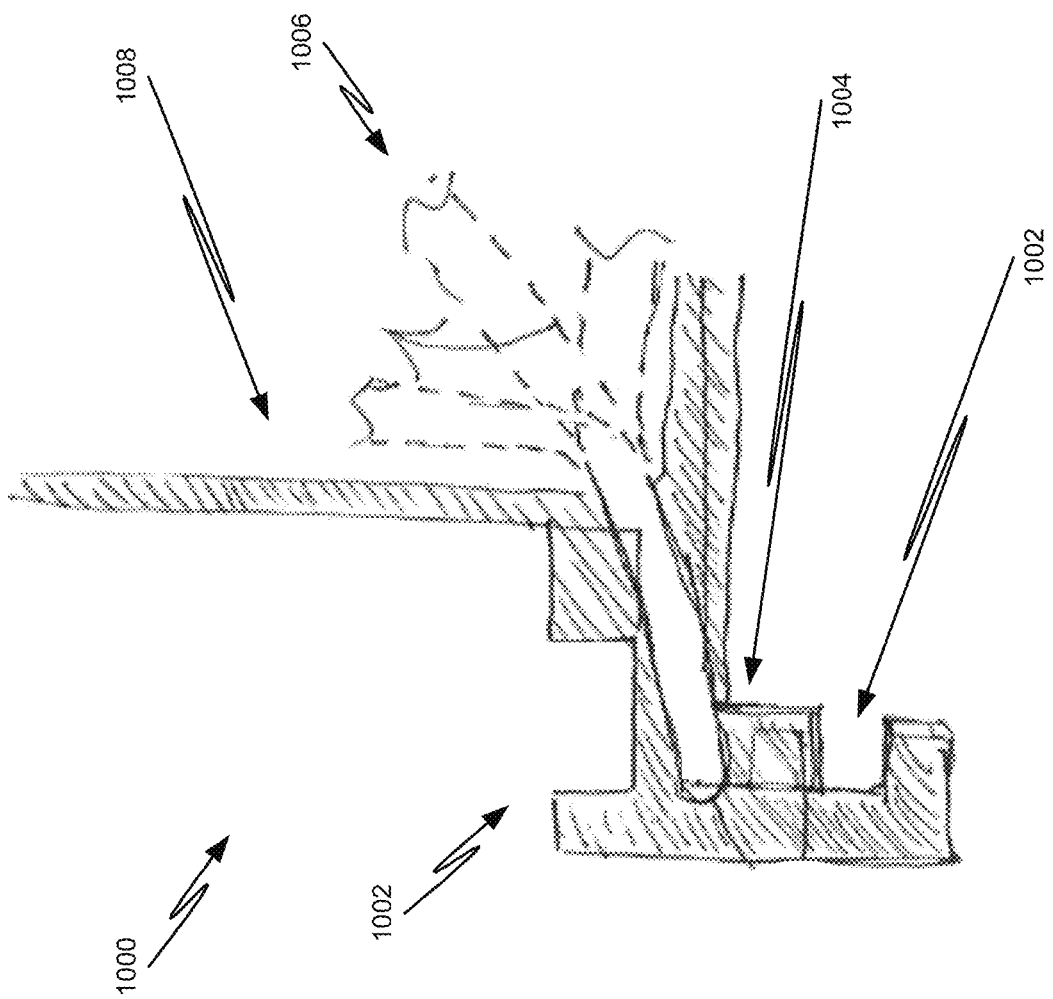

FIG. 10 depicts at 1000 the A-A cross-sectional view of FIG. 9. The cross-sectional view more clearly shows the thermal interfaces 1002 and evaporator channel 1004. Possible condenser paths are shown at 1006 as well as a fin field at 1008. The fin field 1008 performs the following function: heat exchanger for the condenser.

Figure 11:
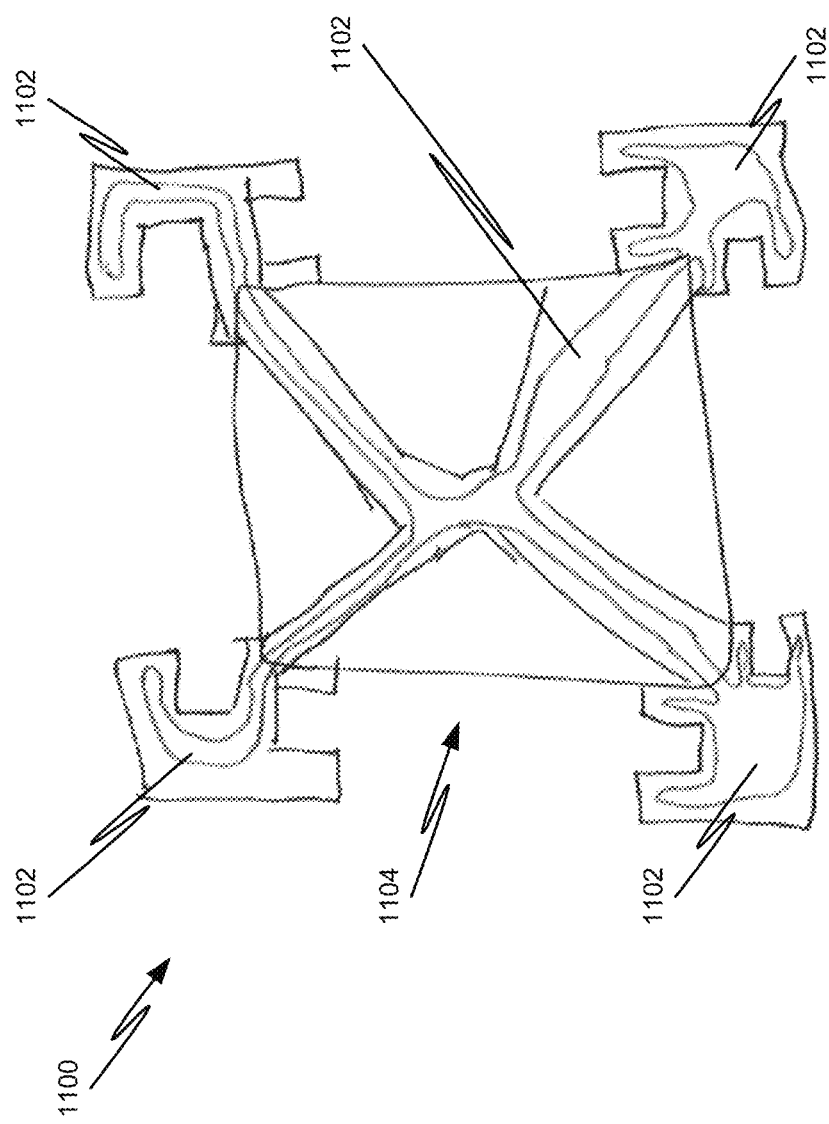
Figure 12:
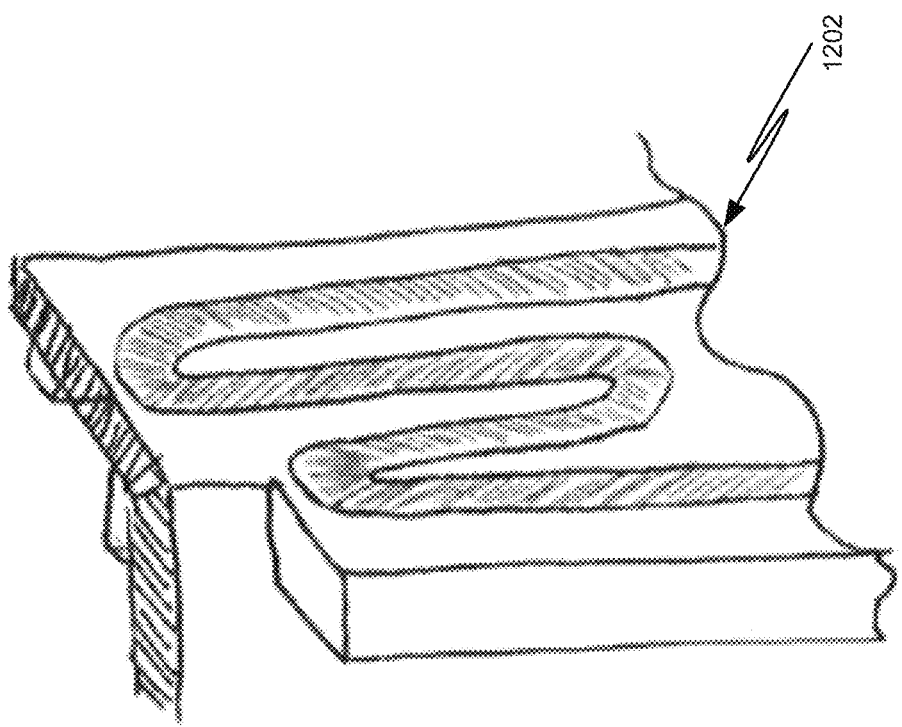
Figure 12:
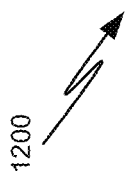

FIG. 11 depicts at 1100 an embodiment illustrating that a heat pipe configuration can include internal cavities 1102 to the heatsink structure 1104 for transporting the heat from the form factor rail portion. FIG. 12 depicts at 1200 an embodiment that shows an internal heat pipe configuration 1202 for conveying heat generated by the components of the embedded computing system. It should be understood that other geometries can be used as heat pipe configurations.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those of ordinary skill in the art with a convenient road map for implementing the described embodiment or embodiments.

It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary. For example, a system can be configured to deviate from a typical system by employing a modular factor. Such a system features a card pack or complete subsystem, such as a video processing suite, encryption suite, etc. In contrast, typical systems are configured on a card-by-card basis.

As another example, a system can be configured with the features described above in order to have one or more of the following benefits:

<50 lbs 12-card chassis.
Available module frame-to-heatsink contact for bonus thermal performance. For example, certain configurations can be an effective alternative to liquid cooled systems.
Rapidly reconfigurable mission-specific requirements.
Decrease in: cost, thermal trickle-down, lead time, required maintenance time and resources, etc.
Increase in: functionality, thermal performance, power, security, reliability, etc.
Provides a plug and play feature suite.
Inexpensive extruded profile.
Design allows for bulk purchase of inexpensive preformed material.
Minimal lead time.
Uses commonly available aerospace alloys.
Useful when high processing power required.

What is claimed is:

1. A mounting frame apparatus for embedding cards within an electronics system, comprising:
a four-card swappable subsystem;
a chassis for containing the four-card swappable subsystem, wherein the chassis includes slots with pairs of grooves in a spaced facing relationship for swapping cards in and out of the chassis for plug and play;
wherein the grooves are U-shaped formed in the outside walls of the chassis for each of the four swappable individual cards;
a cooling structure for supplying cooling air to the four-card swappable subsystem; and
a single heatsink for cooling multiple cards is integrally formed in the four-card swappable subsystem, wherein the single heatsink is attached to the multiple cards and is a common heatsink for the multiple cards.

2. The apparatus of claim 1, wherein the chassis is a scalable chassis that holds additional cards.

3. The apparatus of claim 2, wherein the number of additional cards is more than four.

4. The apparatus of claim 1 further comprising an aluminum frame.

5. The apparatus of claim 1, wherein the four-card swappable system is configured as an application-specific suite.

6. The apparatus of claim 5, wherein the application-specific suite is a video processing suite, a trusted communications suite, a trusted storage suite, or an imaging suite.

7. The apparatus of claim 1, wherein the chassis is configured to contain additional four-card swappable systems for providing multiple application suites.

8. The apparatus of claim 7, wherein the multiple application suites contain two suites selected from the group that includes a video processing suite, a trusted communications suite, a trusted storage suite, and an imaging suite.

9. The apparatus of claim 1, wherein the chassis is configured to have a module frame-to-heatsink contact for cooling the cards.

10. The apparatus of claim 1, wherein the cooling structure supplies cooling air through a single fan or ducted cooling air to be distributed to four 3U sized circuit cards configured around the single heatsink;
wherein the single heatsink is centralized with respect to the four-card swappable subsystem;
wherein the chassis is an extruded chassis of conductive material.

11. A mounting frame apparatus for embedding cards within an electronics system, comprising:
a four-card swappable subsystem;
a chassis for containing the four-card swappable subsystem, wherein the chassis includes slots with pairs of grooves in a spaced facing relationship for swapping cards in and out of the chassis for plug and play;
wherein the grooves are U-shaped formed in the outside walls of the chassis for each of the four swappable individual cards;
a cooling structure for supplying a cooling fluid to the four-card swappable subsystem; and
a single heatsink for cooling multiple cards is integrally formed in the four-card swappable subsystem, wherein the single heatsink is attached to the multiple cards and is a common heatsink for the multiple cards;
wherein the cooling structure includes a condenser channel and an evaporator channel so that heat generated during operation of the embedded cards is exhausted into ambient environment.

12. The apparatus of claim 11, wherein the cooling structure includes internal cavities to the heatsink structure for transporting the heat from rail portions of the chassis.

13. The apparatus of claim 11, wherein the cooling structure includes an internal heat pipe configuration for conveying heat away from the embedded cards.

14. The apparatus of claim 11, wherein the fluid is air or a cooling liquid.

15. The apparatus of claim 11, wherein the cooling structure supplies cooling air through a single fan or ducted cooling air to be distributed to four 3U sized circuit cards configured around the single heatsink.

16. The apparatus of claim 11, wherein the single heatsink is centralized with respect to the four-card swappable subsystem.

17. The apparatus of claim 11, wherein the chassis contains a card rail module that includes a pair of card rails arranged in a spaced facing relationship for holding a circuit card therebetween.

18. The apparatus of claim 17 further comprising a power supply electrically coupled to the card rail module and configured to power the embedded cards.

19. The apparatus of claim 17, wherein the cooling structure is operable to draw a cooling fluid through the card rail module.

20. The apparatus of claim 11, wherein the chassis is configured to contain additional four-card swappable systems for providing multiple application suites.

* * * * *